United States Patent
Tsai et al.

(10) Patent No.: US 9,312,312 B1
(45) Date of Patent: Apr. 12, 2016

(54) DISPLAY

(71) Applicant: Industrial Technology Research Institute, Hsinchu (TW)

(72) Inventors: Yu-Hsiang Tsai, Hsinchu County (TW); Kuo-Lung Lo, New Taipei (TW); Pei-Pei Cheng, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/585,196

(22) Filed: Dec. 30, 2014

(51) Int. Cl.
*H01L 23/62* (2006.01)
*H01L 27/32* (2006.01)
*H01L 29/49* (2006.01)
*H01L 51/05* (2006.01)

(52) U.S. Cl.
CPC ......... *H01L 27/3216* (2013.01); *H01L 27/3248* (2013.01); *H01L 29/4908* (2013.01); *H01L 51/0508* (2013.01)

(58) Field of Classification Search
CPC ............ H01L 21/76205; H01L 21/8229; H01L 27/3248; H01L 27/124; H01L 27/1463; H01L 27/1251; H01L 27/0814; H01L 27/3262; H01L 29/4908; H01L 51/0508; H01L 51/5296; H01L 51/5287
USPC ............ 257/40, 79, 104, 359, 642, 759, 257/E21.006, E21/051, E21/053, E21.267, 257/E21.352, E21.366, E21.411, E21.577
See application file for complete search history.

(56) References Cited

U.S. PATENT DOCUMENTS

| | | | |
|---|---|---|---|
| 7,215,401 B2 * | 5/2007 | Ishiyama | G02F 1/136227 349/143 |
| 8,357,938 B2 | 1/2013 | Yoon et al. | |
| 8,421,342 B2 | 4/2013 | Hong | |
| 8,558,222 B2 | 10/2013 | Hwang et al. | |
| 8,598,582 B2 | 12/2013 | Choi et al. | |

(Continued)

FOREIGN PATENT DOCUMENTS

| CN | 102362215 | 2/2012 |
|---|---|---|
| CN | 104134683 | 11/2014 |

(Continued)

OTHER PUBLICATIONS

Kuo et al., "Blur-Free Transparent LCD with Hybrid Transparency," SID Symposium Digest of Technical Papers, Jun. 2013, pp. 70-73.

(Continued)

*Primary Examiner* — David Nhu
(74) *Attorney, Agent, or Firm* — Jianq Chyun IP Office

(57) ABSTRACT

A display including a plurality of display units and a plurality of holes is provided. Each of the display units includes a transparent area. Each of the holes is formed by a part of the transparent areas. At least one of the holes satisfies $$2\sqrt{\pi A} \leq S < \frac{8}{3}\sqrt{3A},$$

wherein A is an area of each of the holes and the S is a perimeter of each of the holes, and the at least one of the holes is a hole of a non-quadrilateral-type shape. These holes are arranged along a first direction in staggered arrangement, parts of projections of the holes along a second direction are overlapped with one another, and the first direction is different from the second direction.

16 Claims, 21 Drawing Sheets

(56) References Cited

U.S. PATENT DOCUMENTS

| | | | |
|---|---|---|---|
| 9,122,143 B2 * | 9/2015 | Shields | G03B 21/60 |
| 2012/0153321 A1 | 6/2012 | Chung et al. | |
| 2012/0280215 A1 | 11/2012 | Choi et al. | |

FOREIGN PATENT DOCUMENTS

| | | |
|---|---|---|
| JP | 2008091070 | 4/2008 |
| JP | 2012248449 | 12/2012 |
| KR | 20130071543 | 7/2013 |
| TW | 201225278 | 6/2012 |
| TW | 201239474 | 10/2012 |

OTHER PUBLICATIONS

Song et al., "11.3: Distinguished Paper: LTPS-based Transparent AMOLED," SID Symposium Digest of Technical Papers, May 2010, pp. 144-147.

Chung et al., "11.4: Transparent AMOLED Display Based on Bottom Emission Structure," SID Symposium Digest of Technical Papers, May 2010, pp. 148-151.

"Office Action of Taiwan Counterpart Application," issued on Jan. 21, 2016, p1-p5, in which the listed references were cited.

* cited by examiner

Original image without through holes

Image observed through the holes

Result obtained after merging the openings of the sub-pixels, and then merging the upper and lower pixels followed by staggered arrangement Original image without through holes Image observed through the holes Result obtained after merging the openings of the sub-pixels, and then merging the upper and lower pixels followed by staggered arrangement

DISPLAY

TECHNICAL FIELD

The disclosure relates to a display.

BACKGROUND

As electronic products developed towards the trend of compact design with the capability of transmitting massive amount of information and images, people's demands for compact flat-panel displays and better image quality is increasingly higher. Since the beginning of developments in organic light-emitting diode (OLED) devices, many people have been attracted to invest in research and mass production of OLED displays which are considered as one of the flat display technologies with the most development potential in succession to thin film transistor liquid crystal displays (TFT LCDs).

In addition to advantages such as self-luminescence, high response time characteristic (1us), power saving (with only one third power consumption of the TFT LCDs), wide viewing angle (180 degrees), wide color gamut (NTSC 100% or more), low operating voltage (3 to 10V), high contrast (as high as $10^4$:1), more importantly, the OLED is favorable because of its slimness feature (a thickness of the panel may be less than 1 mm) together with self-luminescence and simplified panel structure for realizing a transparent mode display more easily. It could be applied in a new generation display panel.

While allowing transmission of lights from the outside environment to pass through a display structure, the transparent display panel is also capable of forming images by emitting image lights from pixels on the display. In order to achieve aforesaid effects, a plurality of holes are often formed on the existing transparent display panel, and then display pixels capable of emitting the image lights are disposed between those holes. Accordingly, users are able to observe images behind the display panel through the holes while viewing the images presented by the display pixels between the holes. However, aforementioned holes may also lead to diffraction effect when outside light pass through the holes. As such, transmissive images from behind the display panel may be too blur for the users to observe or presented in poor quality.

SUMMARY

A display according to embodiments of the disclosure includes a plurality of display units and a plurality of holes. Each of the display units includes a transparent area and a non-transparent area, and the non-transparent area includes a light-emitting area. Each of the holes is formed by a part of the transparent areas. At least one of the holes satisfies $$2\sqrt{\pi A} \leq S < \frac{8}{3}\sqrt{3A},$$

wherein A is an area of each of the holes and the S is a perimeter of each of the holes, and the aforementioned at least one of the holes is a hole of a non-quadrilateral-type shape. These holes are arranged along a first direction in staggered arrangement, parts of projections of the holes along a second direction are overlapped with one another, and the first direction is different from the second direction.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
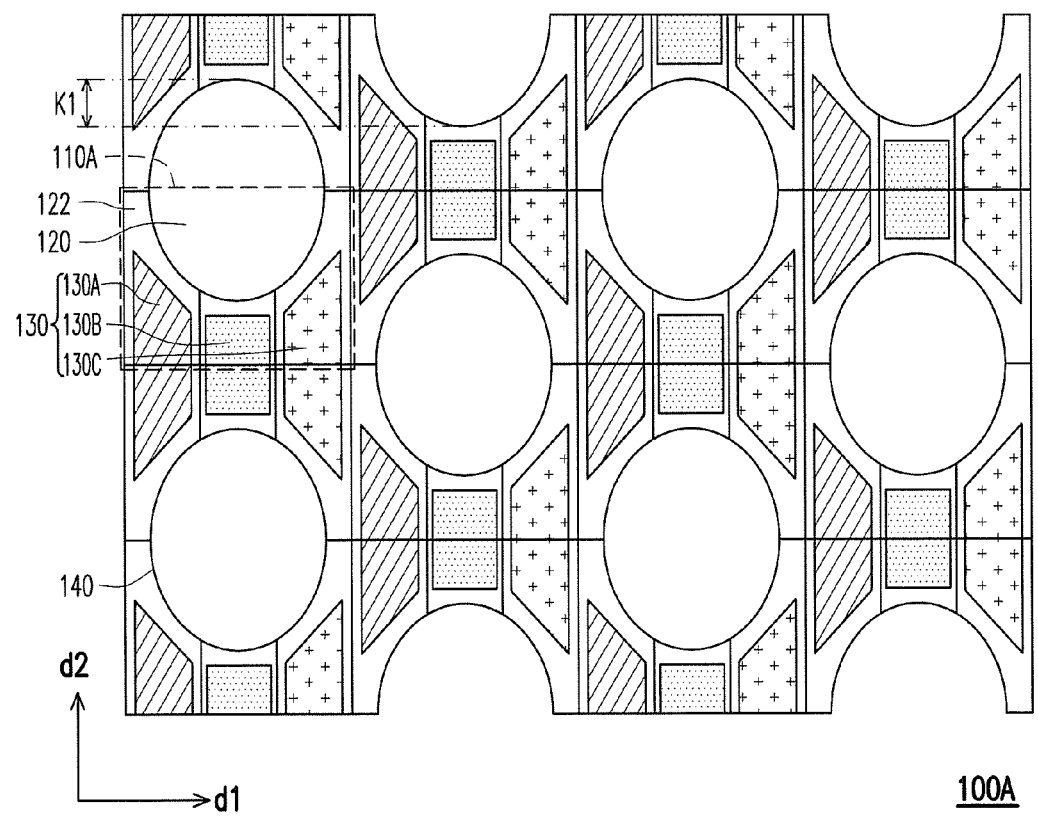
FIG. 1A is a schematic view of a display according to a first embodiment of the disclosure.

FIG. 1A is a schematic view of a display according to a first embodiment of the disclosure. Pixels and sub-pixels illustrated in the drawings cited in descriptions for the embodiments of the disclosure are used to clearly explain a disposition relationship between holes and pixels in the embodiments of the disclosure instead of limiting a shape, an amount and a size of each of the pixels and the sub-pixels. Referring to FIG. 1A, in the first embodiment of the disclosure, a display 100A includes a plurality of display units 110A and a plurality of holes 140. Each of the display units 110A includes a transparent area 120 and a non-transparent area 122. Herein, the non-transparent area 122 refers to an area other than the transparent area 120 in the display unit 110A, and such area includes areas where other semi-transparent or transparent devices (e.g., thin film transistor (TFT), capacitors or wires) are disposed. Each of the holes 140 is formed by a part of the transparent areas 120, and each of the holes 140 satisfies $$2\sqrt{\pi A} \leq S < \frac{8}{3}\sqrt{3A},$$

where A is an area of each of the holes 140, and S is a perimeter of each of the holes 140, that is, a length of edges of each of the holes 140. In an embodiment, each of the holes satisfies $$2\sqrt{\pi A} \leq S < 4\sqrt{A},$$

and, in another embodiment, each of the holes satisfies $$2\sqrt{\pi A} \leq S < 6\sqrt{\frac{2A}{3\sqrt{3}}}.$$

A shape of each of the holes 140 is a non-quadrilateral-type shape. In view of the above content, in the present embodiment, a ratio of the area A to the perimeter S (i.e., the length of the edges of each of the holes 140) of each of the holes 140 falls within said favorable ranges, so that an edge diffraction generated by the lights passing through the holes 140 will not be too much, and yet sufficient hole areas can be provided for forming favorable transmissive images. The edge diffraction of the holes may be reduced by combining the transparent areas, minimizing the edges, and adopting a staggered arrangement. The holes 140 are arranged along a direction d1 in staggered arrangement, and parts of projections of the holes 140 projected in a direction d2 have an overlapping area K1 which provides different combinations in terms of spatial frequency. Herein, the direction d1 is different from the direction d2 (in the present embodiment, they are, for example, perpendicular to each other, but the disclosure is not limited thereto). In other words, by disposing the holes 140 at locations where a fixed spatial frequency arrangement can be depressed, the edge diffraction effect occurred when the lights pass through the holes 140 may be further reduced while breaking generation of a diffraction effect in a fixed direction, so as to improve the overall image.

Referring to FIG. 1A, in the first embodiment of the disclosure, the holes 140 in the display 100A are, for example, foamed by two of the transparent areas 120 which are interconnected, and a shape of each of the holes 140 is an oval shape. Specifically, since the hole 140 of the present embodiment is of the oval shape, the perimeter thereof is relatively shorter than that of a rectangle with an equal area to favorably improve phenomenon of the edge diffraction. Also, the hole has a long-axis and a short-axis which are asymmetric and adapted to form partially overlapped projections in one direction and break a periodical diffraction, so as to provide clear and favorable transmissive images. In other words, in the circumstance where the perimeters of the holes 140 are the same, because the holes 140 satisfying aforementioned ranges are of the non-quadrilateral-type shape, the areas of the holes 140 may be larger. As such, a favorable light transmission efficiency may be provided. On the other hand, because the long-axes of the oval holes 104 are arranged along the direction d2 and the parts of the projections thereof in the direction d2 are overlapped with one another, the fixed spatial frequency for disposing the holes may then be disturbed.

Herein, in the embodiment of the disclosure, when each of the holes includes four edges and corners are in shapes of acute angles, right angles, obtuse angles, round-corners or chamfers, these holes belong to a quadrilateral type shape. That is to say, the "quadrilateral type shape" in the "non-quadrilateral-type shape" proposed herein includes a shape similar to a tetragon or a shape that is an accurate (strict) tetragon, and descriptions regarding a hexagon type shape, an octagon type shape and the like also adopt the same analogy. Furthermore, in the disclosure, a circular type shape includes a shape similar to a circle or a perfect circle (i.e., an accurate circle or a strict circle), and the oval type shape includes a shape similar to an ellipse or a shape that is an accurate (strict) ellipse.

Figure 1B:
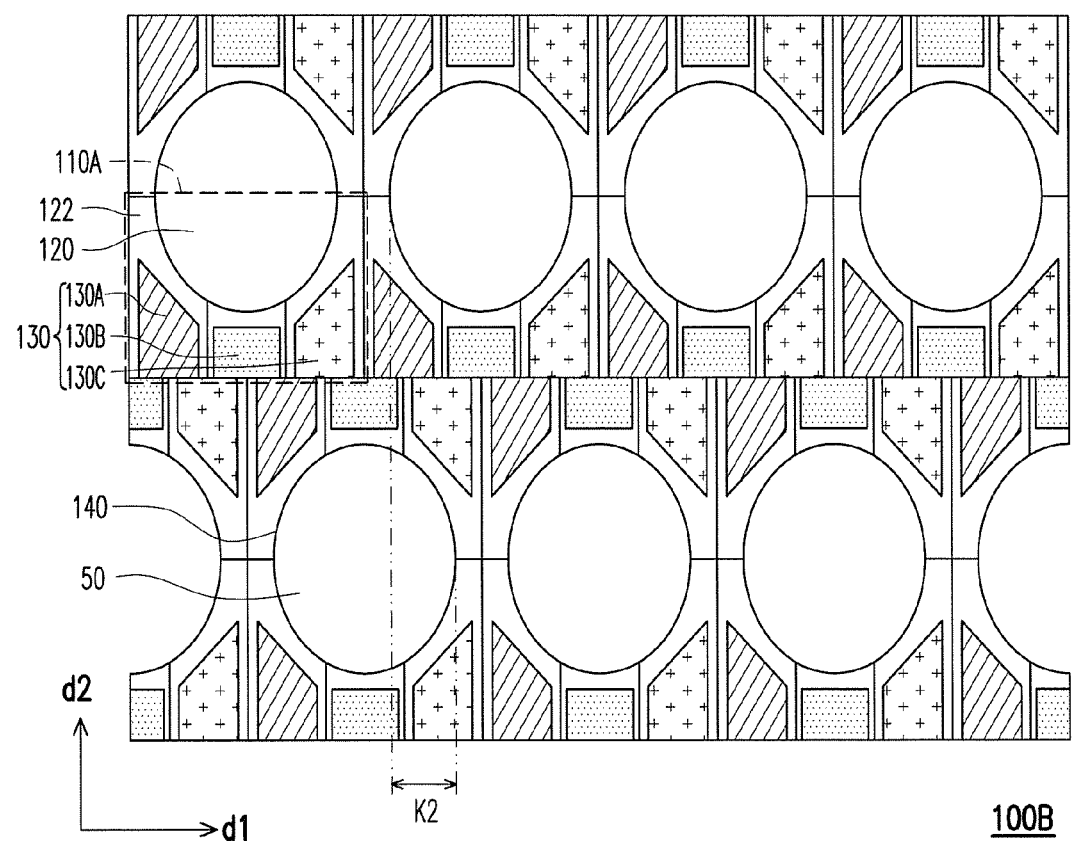
FIG. 1B is a schematic view of a display according to a second embodiment of the disclosure.

FIG. 1B is a schematic view of a display according to a second embodiment of the disclosure. In the second embodiment of the disclosure, the holes 140 may also be arranged along the direction d2 in staggered arrangement, and the projections of the holes 140 projected in the direction d1 are overlapped with one another. In other words, in the embodiments of the disclosure, the oval holes 140 are not limited only to include the parts of the projections overlapped with one another in the overlapping area K1 along a long-axis direction (i.e., the direction d2) as shown in the display 100A, but also include parts of projections overlapped with one another in an overlapping area K2 along a short-axis direction (i.e., the direction d1) as shown in a display 100B.

Figure 1C:
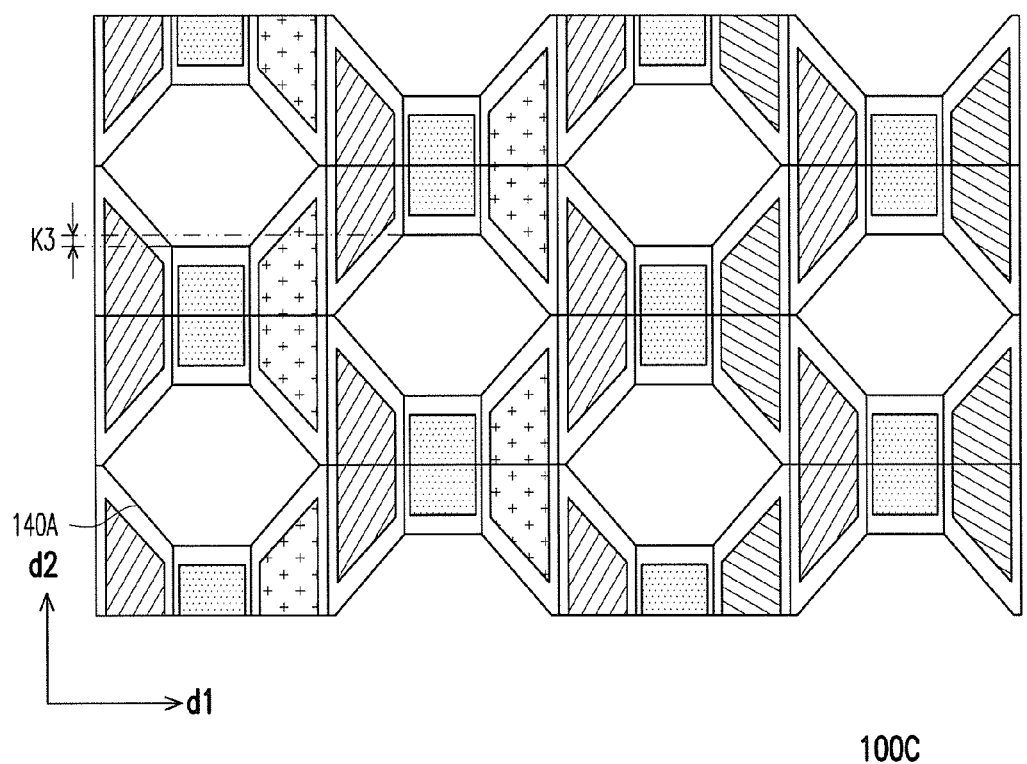
FIG. 1C is a schematic view of a display according to a third embodiment of the disclosure.
Figure 1D:
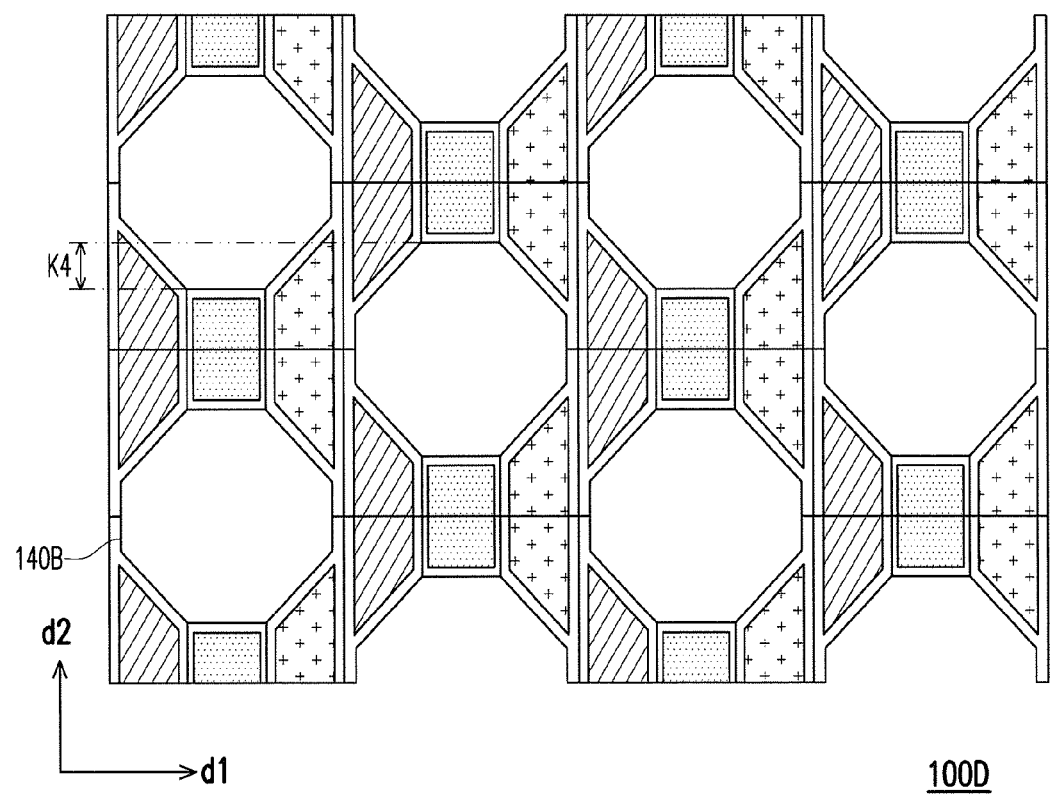
FIG. 1D is a schematic view of a display according to a fourth embodiment of the disclosure.

FIG. 1C is a schematic view of a display according to a third embodiment of the disclosure. In the embodiments of the disclosure, the holes of the non-quadrilateral-type shape are not limited to the circular shape or the oval shape as described above. Referring to FIG. 1C, in the third embodiment of the disclosure, a shape of holes 140A in a display 100C may also be a hexagon shape, and the holes 140A of the hexagon shape are also arranged along the direction d1 in staggered arrangement and the projections thereof in the direction d2 have an overlapping area K3, so that the image light beam being passed through may present the favorable images. FIG. 1D is a schematic view of a display according to a fourth embodiment of the disclosure. In the fourth embodiment of the disclosure, a shape of holes 140B of a display 100D may also be an octagon type shape, and the holes 140B of the octagon type shape are also arranged along the direction d1 in staggered arrangement and the projections thereof in the direction d2 have an overlapping area K4, so that the image light beam being passed through may present the favorable images. The holes 140A and the holes 140B satisfy $$2\sqrt{\pi A} \leq S < \frac{8}{3}\sqrt{3A},$$

so that the edge diffraction generated by the light beams passing through the holes 140A and 140B will not be too much, yet sufficient hole areas can be provided for forming favorable transmissive images, and the fixed spatial frequency for disposing the holes may be disturbed by the staggered arrangement.

Referring to FIG. 1A, in the first embodiment of the disclosure, the display 100A further includes a plurality of display pixels 130. The display unit 110A further includes the non-transparent area 122, and the display pixels 130 are disposed on the non-transparent areas 122 of the display units 110A, respectively. Each of the display pixels 130 includes a plurality of sub-pixels 130A, 130B and 130C, and the sub-pixels 130A, 130B and 130C emit the image lights having a plurality of colors. Specifically, in the present embodiment, the display pixel 130 is, for example, composed of a first sub-pixel 130A that emits a light of first color (e.g., a red light), a second sub-pixel 130B that emits a light of second color (e.g., a green light) and a third sub-pixel 130C that emits a light of third color (e.g., a blue light), and these sub-pixels 130A, 130B and 130C are used to provide favorable images. Also, in each of the display pixels 130, a size of the second sub-pixel 130B is different from a size of the first sub-pixel 130A or a size of the third sub-pixel 130C, but the invention is not limited thereto. In other embodiments, it is also possible that sub-pixels with different amounts or sizes may be used to compose one display pixel, and the sub-pixels may emit the light of other colors.

Referring to FIG. 1A in the first embodiment of the disclosure, the display pixels 130 on the non-transparent areas 122 are, for example, formed by organic light-emitting diodes formed on a transparent substrate 50, so that lights coming from the back of the display 100B may pass through the transparent substrate 50 and the holes 140 of the display unit in sequence so as to be transmitted to eyes of users. However, in other embodiments, the holes 140 may also located at spaces where the organic light-emitting diodes are not formed. That is to say, aforesaid holes 140 may be forming on the transparent substrate 50 at locations where none of display pixels 130 are located. In other embodiments, the organic light-emitting diodes may also be replaced by other suitable passive light-emitting structures, such as those used in a transparent liquid crystal display, a reflective liquid crystal display or reflective electrophoretic display, or the organic light-emitting diodes may also be replaced by other active light-emitting structures, such as those used in a liquid crystal display, a self-luminescence electrowetting display. Aforementioned transparent substrate 50 for disposing the organic light-emitting diodes may also be disposed with electronic devices or electrical connecting lines (e.g., data lines, scan lines, thin film transistors, etc.) which are electrically connected to the display pixels 130. In other embodiments, dispositions for the desired electronic devices may be adjusted based on, for example, use of the transparent liquid crystal display (LCD), reflective type LCD or the self-luminescence electrowetting display, and a material of the transparent substrate 50 may also be selected based on different applications of the display, which are not particularly limited in the disclosure.

Other embodiments are described below to illustrate the disclosure more clearly. The reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 1E:
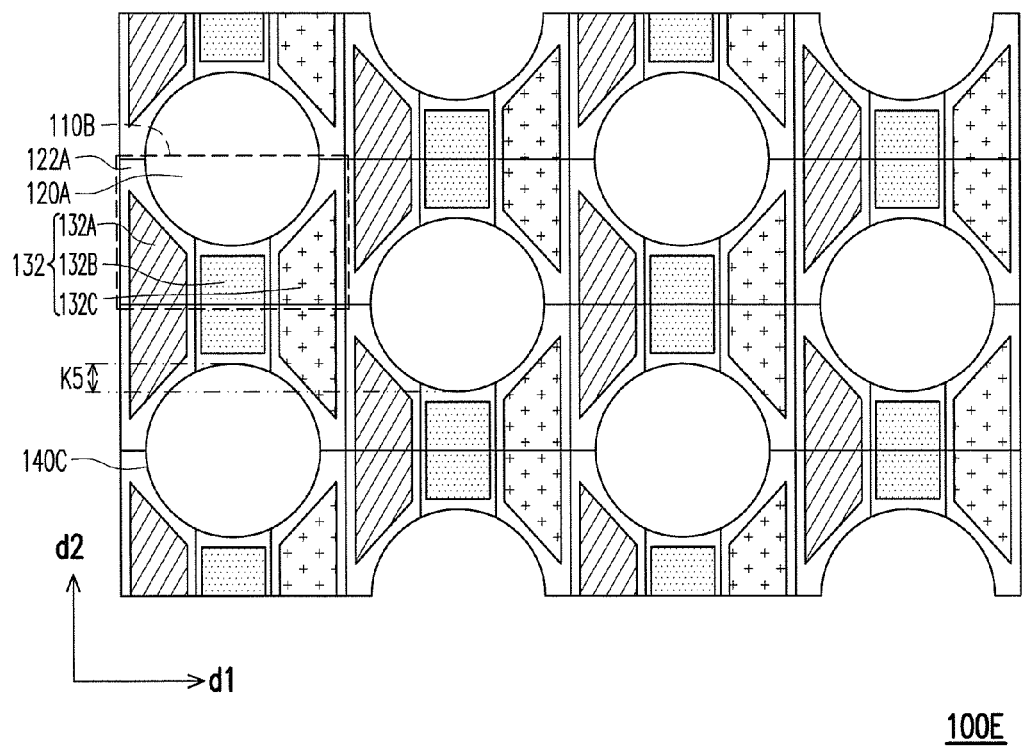
FIG. 1E is a schematic view of a display according to a fifth embodiment of the disclosure.

Referring to FIG. 1A, in the first embodiment of the disclosure, in adjacent two of the display pixels 130 in the direction d2 of the display 100A, parts of the sub-pixels (130A, 130B, 130C) emitting the light of the same color are connected to each other. That is to say, in the first sub-pixel 130A of the display pixel 130 is, for example, connected to the first sub-pixel 130A of another display unit 110A located therebelow, the second sub-pixel 130B is, for example, connected to another second sub-pixel 130B located therebelow, and the third sub-pixel 130C is, for example, connected to another third sub-pixel 130C located therebelow. As such, a complexity in production may be reduced to provide a more preferable yield rate. In the embodiments of the disclosure, taking the organic light-emitting diodes as an example, in which an organic light-emitting material with different light-emitting wavelengths is deposited by a vacuum thermal evaporation method. Accordingly, during production of a high resolution panel, because a size and an interval of the sub-pixel are both smaller, openings of the fine metal mask may also become smaller. In the present embodiment, by connecting two sub-pixels that emit the light of the same color, issues such as dimensional error in the fine metal mask and blockages of the openings may be solved. The similar effect may also be adapted in coating the organic light-emitting material by an ink jet printing method, but the disclosure is not limited thereto. FIG. 1E is a schematic view of a display according to a fifth embodiment of the disclosure. Referring to FIG. 1E, a display 100E is substantially similar to the display 100A, and major differences between the two are provided as follows. A shape of holes 140C of the display 100E is a circle, such that a larger area for disposing sub-pixels 132A, 132B and 132C of display pixels 132 may be provided. Also, the holes 140C are arranged along the direction d1 in staggered arrangement, and parts of projections thereof in the direction d2 have an overlapping area K5, such that influences from the diffraction caused by a single spatial frequency may be reduced to provide favorable frames. Furthermore, in the embodiments of the disclosure, users may change the disposition of the holes 140C and the non-transparent areas 122A (i.e., a disposition of the transparent area 120A and the non-transparent area 122A in a display unit 110B), and may reduce the fixed spatial frequency for disposing the holes by the staggered arrangement of the holes 140C formed by the transparent areas 120A and the parts of the projections thereof being overlapped in at least one direction. Also, the holes 140C satisfy $$2\sqrt{\pi A} \leq S < \frac{8}{3}\sqrt{3A},$$

so that the edge diffraction generated by the light beams passing through the holes 140C will not be too much, and yet sufficient hole areas can be provided for forming favorable transmissive images.

Figure 2A:
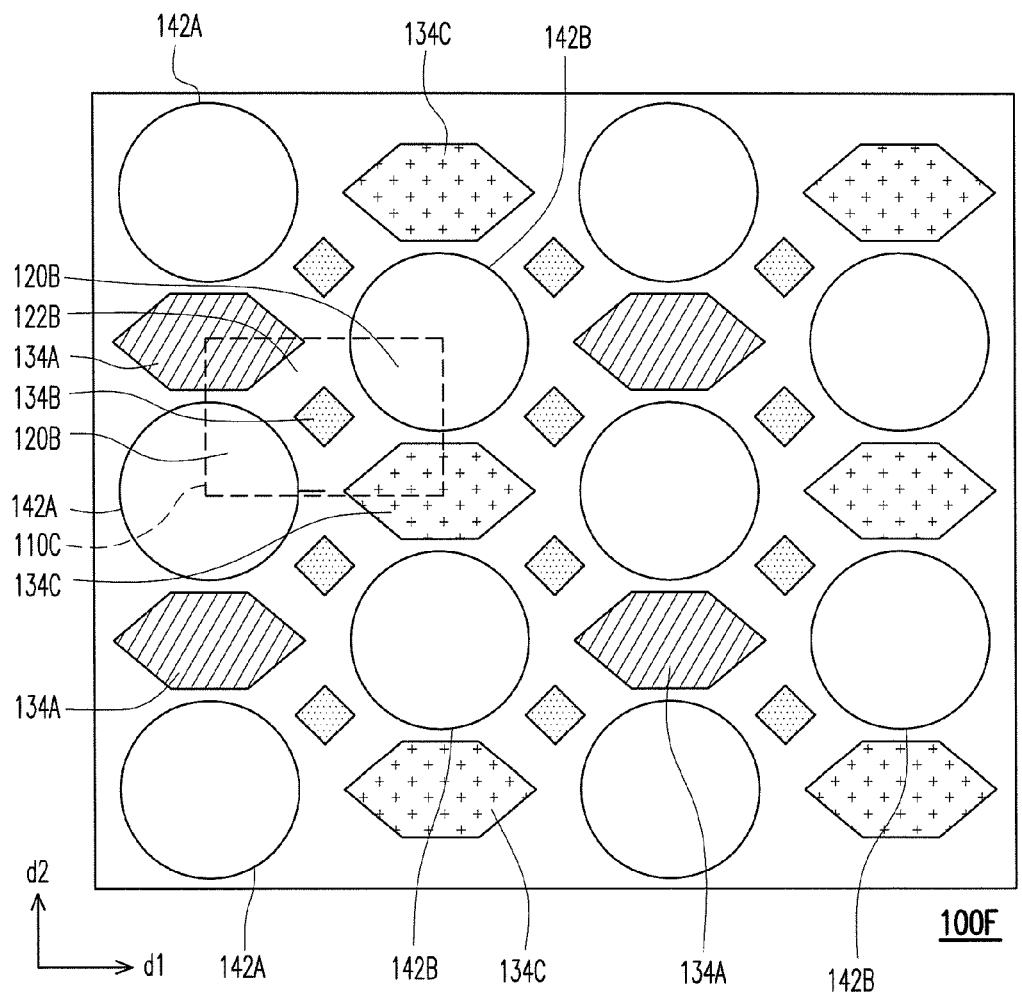
FIG. 2A is a schematic view of a display according to a sixth embodiment of the disclosure.

FIG. 2A is a schematic view of a display according to a sixth embodiment of the disclosure. Referring to FIG. 1E and FIG. 2A, a display 100F is substantially similar to the display 100E, both of the two have parts of projections of the holes in the direction d2 which have, for example, the overlapping area K5, and a major difference between the two is the disposition of the display pixels. In the present embodiment, two openings 120B are included in a transparent area of a display unit 110C of the display 100F. The two openings 120B are disposed at two opposite angles of the display unit 110C, each four of the openings 120B in the display 100F are interconnected, and a hole 142A (or 142B) is formed by the four interconnected openings 120B. A second sub-pixel 134B is disposed between a first sub-pixel 134A and a third sub-pixel 134C, and the second sub-pixel 134B is disposed between the two openings 120B. In other words, in the present embodiment, the first sub-pixel 134A, the second sub-pixel 134B and the third sub-pixel 134C are, for example, disposed on a non-transparent area 122B along a diagonal line of the display unit 110C. In the present embodiment, the first sub-pixels 134A and a part of the holes (e.g., the holes 142B) are alternately arranged along the direction d1, the second sub-pixels 134C and the holes 142B are alternately arranged along the direction d2, and the direction d1 is different from the direction d2. On the other hand, in the present embodiment, the first sub-pixels 134A and another part of the holes (e.g., the holes 142A) are also alternately arranged in the direction d2, the third sub-pixels 134C and the holes 142A are alternately arranged along the direction d1. In the present embodiment, the holes 142A and 142B are of the circular shape, and are alternately arranged in the direction d1, but the disclosure is not limited thereto. In other embodiments, the holes in the display 100F with the disposition similar to FIG. 2A may also include aforementioned non-quadrilateral-type shape such as the oval type shape, the hexagon type shape or the octagon type shape. Alternatively, in other embodiments, the shape of the holes may include a circular shape, an oval shape, a polygon having more than four edges, or a combination thereof.

In above description for the present embodiment, the first sub-pixels 134A or the third sub-pixels 134C of the display unit 110C substantially refers to parts of the first sub-pixels 134A or parts of the third sub-pixels 134C, respectively. In other words, in the present embodiment, the entire first sub-pixels 134A (or the entire third sub-pixels 134C) are formed by the parts of the first sub-pixels 134A (or the parts of the third sub-pixels 134C) in four different adjacent display units 110C. Further, the entire first sub-pixels 134A or the entire third sub-pixels 134C are driven by the same electrode. That is to say, when the entire first sub-pixels 134A or the entire third sub-pixels 134C are lighted up, they emit light at the same time. In other words, in the present embodiment, the adjacent display units 110C commonly use the first sub-pixels 134A and the second sub-pixels 134C. That is to say, the display 100F of the present embodiment is disposed in an arrangement in which adjacent pixels commonly use the same sub-pixel.

Figure 2B:
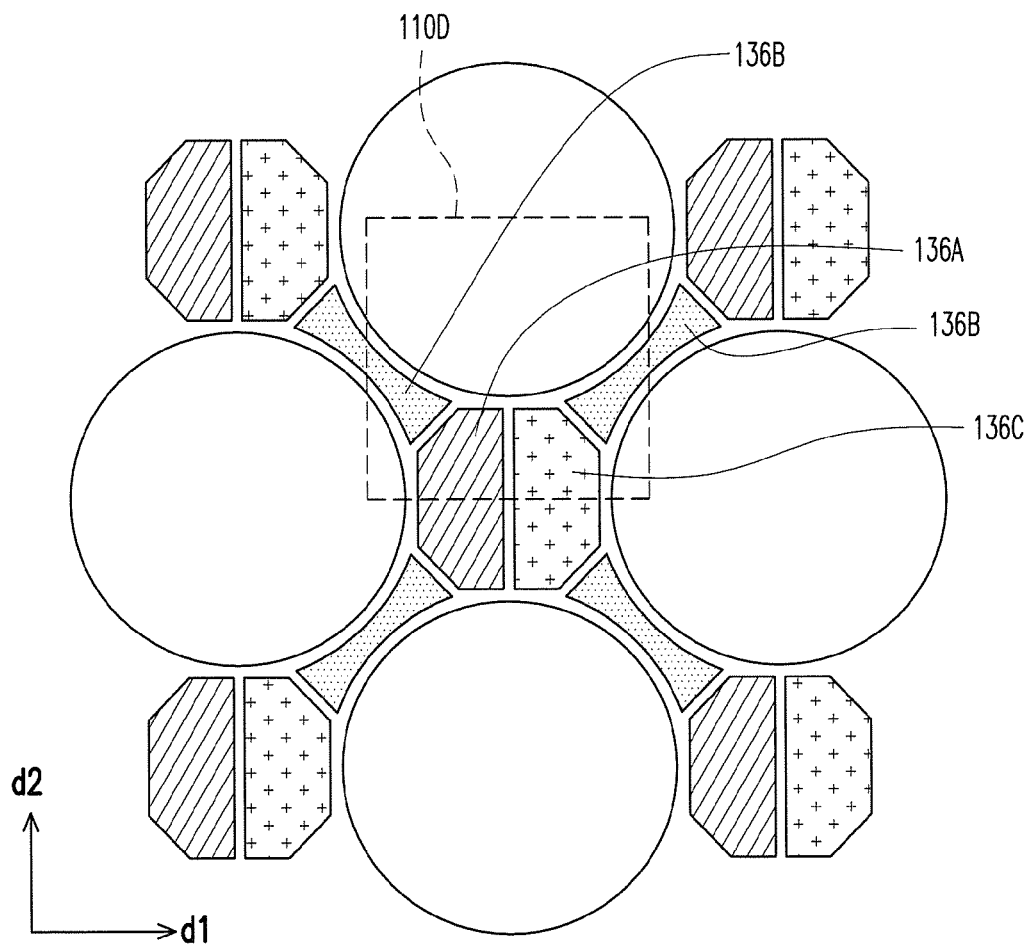
FIG. 2B is a schematic view of a display according to a seventh embodiment of the disclosure.

Other embodiments are described below to illustrate the disposition relationship between the display pixels and the holes more clearly. FIG. 2B is a schematic view of a display according to a seventh embodiment of the disclosure. Referring to FIG. 2B, in the seventh embodiment of the disclosure, a display unit 110D includes a disposition similar to the holes 142A and 142B of said sixth embodiment. However, the difference therebetween is that a first sub-pixel 136A and a third sub-pixel 136C of the display pixel of the present embodiment are combined to form a shape of hexagon to be disposed between four of the holes. Also, second sub-pixels 136B are also different from aforesaid second sub-pixels 134B which is the sub-pixel structure of the quadrilateral shape. The second sub-pixel 136B is formed in a funnel shape and disposed between the first sub-pixel 136A and the third sub-pixel 136C. Accordingly, the sub-pixels 136A, 136B and 136C may be disposed in between the holes with higher coverage rate.

Figure 2C:
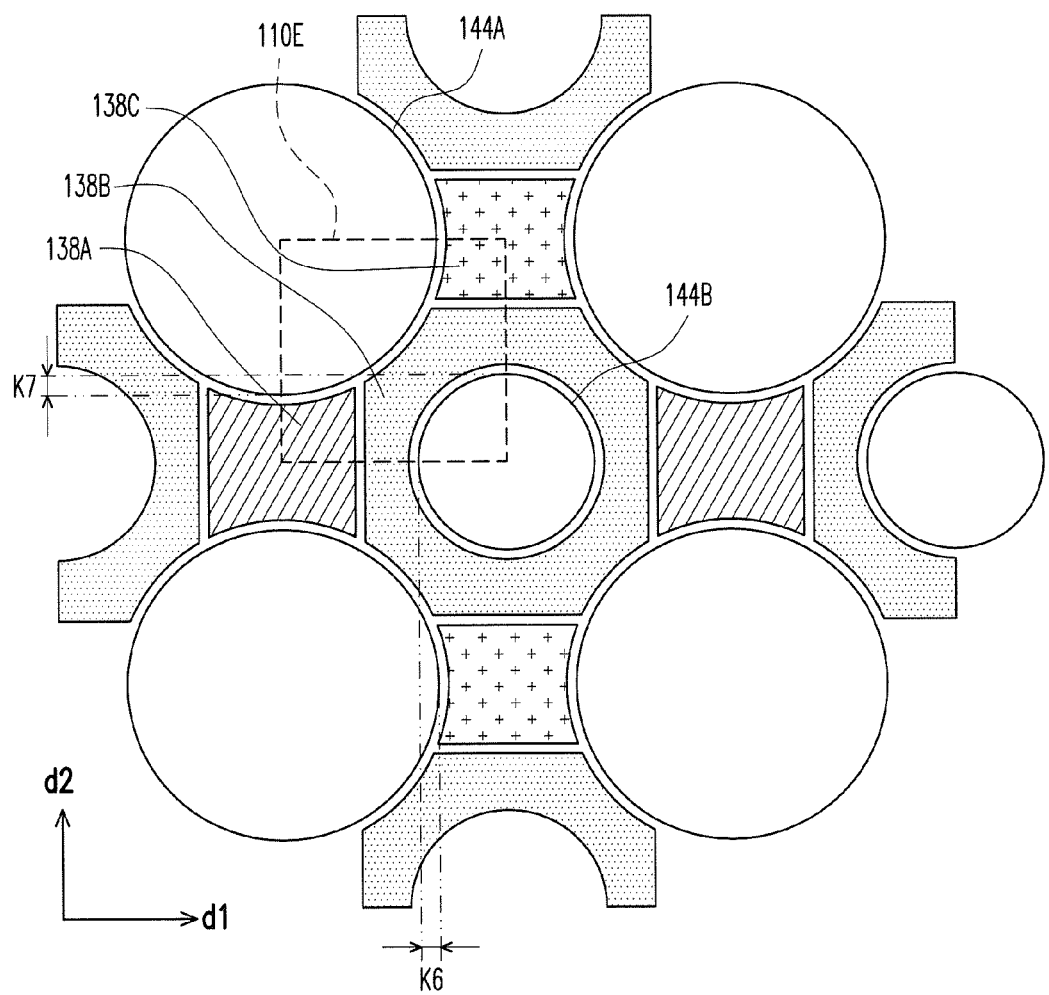
FIG. 2C is a schematic view of a display according to an eighth embodiment of the disclosure.

FIG. 2C is a schematic view of a display according to an eighth embodiment of the disclosure. Referring to FIG. 2C, in the eighth embodiment of the disclosure, each of holes is composed of a hole 144A and a hole 144B, and sizes of the holes 144A and 144B are different (i.e., the hole 144A is larger than the hole 144B). On the other hand, in the present embodiment, each of a first sub-pixel 138A and a third sub-pixel 138C is formed between adjacent two of the holes 144A, and a second sub-pixel 138B is formed on the remained area to surround the hole 144B. In other words, in the present embodiment, the sub-pixels 138A, 138B and 138C of display units 110E surround the holes 144A and 144B by aforesaid disposition in order to provide the good display frames. On the other hand, because parts of projections of the holes 144A and 144B in the direction d1 have an overlapping area K6, and parts of projections of the holes 144A and 144B in the direction d2 have an overlapping area K7, a diffraction enhancement in the fixed direction may also be broken.

Figure 2D:
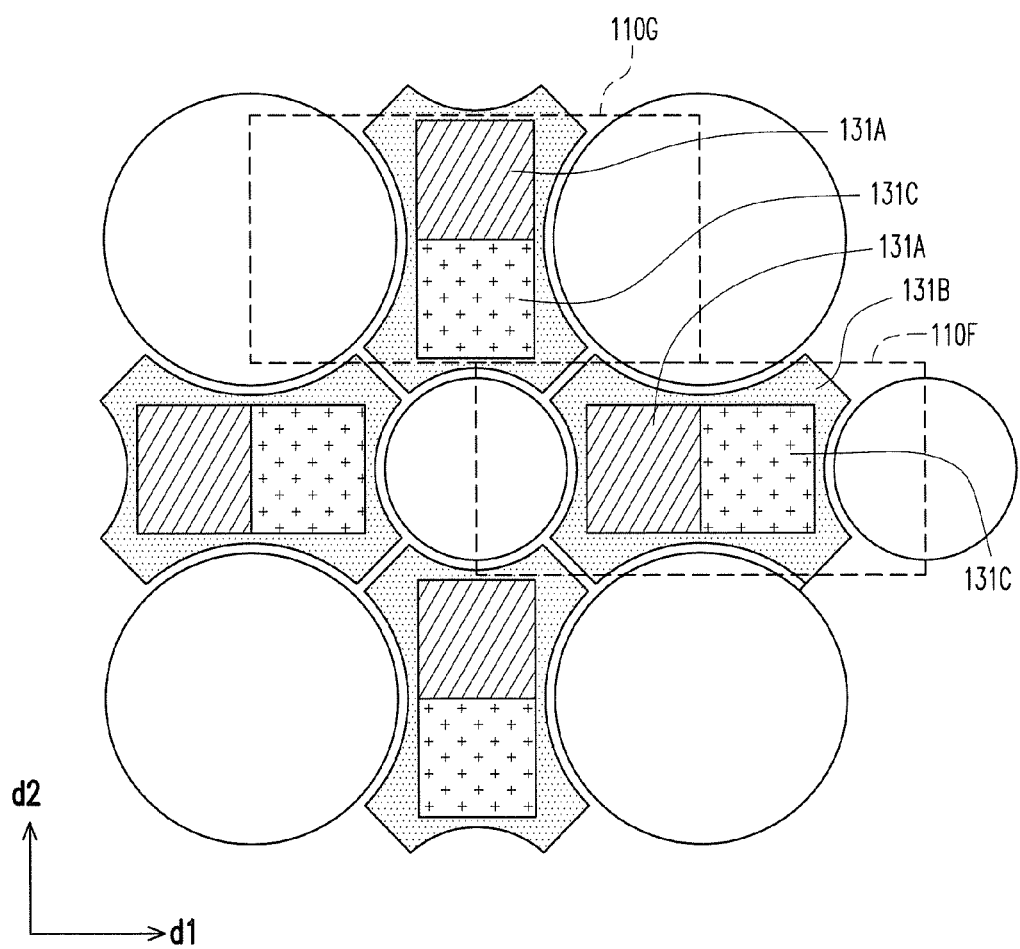
FIG. 2D is a schematic view of a display according to a ninth embodiment of the disclosure.

FIG. 2D is a schematic view of a display according to a ninth embodiment of the disclosure. Referring to FIG. 2D, a display in the ninth embodiment of the disclosure is similar to the display of the eighth embodiment. However, the difference therebetween is that display pixels of the present embodiment include two disposition methods. A first sub-pixel 131A and a third sub-pixel 131C in a display unit 110F are disposed along the direction d1, the first sub-pixel 131A and the third sub-pixel 131C in a display unit 110G are disposed along the direction d2, and the second sub-pixel 131 is distributed among the remained areas for both of said display units. In other words, in the present embodiment, the display units 110F and 110G surround the holes by aforesaid dispositions in order to provide the more preferable display frames.

Figure 3A:
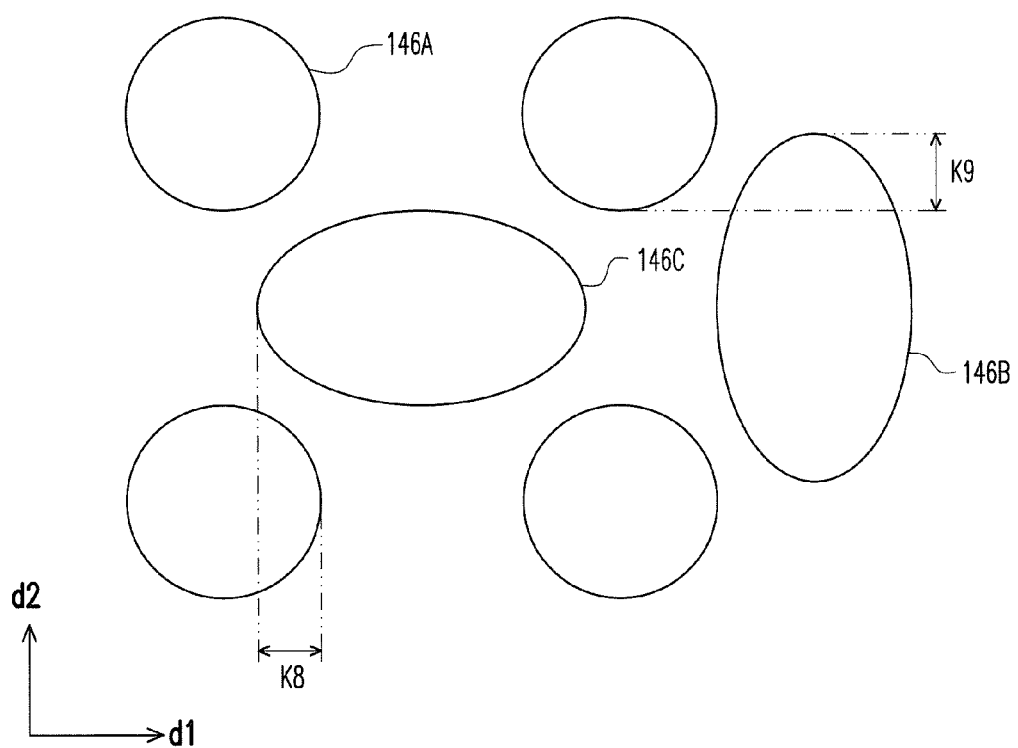
FIG. 3A is a schematic partial view of a display according to a tenth embodiment of the disclosure.

Several more embodiments are described below to further illustrate the disposition relationship between the holes. For clear descriptions, illustration of display pixels are partially omitted in drawings cited below, but this is not intended to limit the disclosure. More specifically, all of the embodiments described below may combine use of aforesaid display pixels, and these embodiments mainly serve to describe various combinations of the holes as well as the characteristic that projections of the holes are overlapped in one specific direction. FIG. 3A is a schematic partial view of a display according to a tenth embodiment of the disclosure. Referring to FIG. 3A, in the tenth embodiment of the disclosure, holes include holes 146A, 146B and 146C. The holes 146B and 146C are oval holes, and the hole 146A is a circular hole. Specifically, in the present embodiment, long-axes of the holes 146B are disposed along the direction d2, and long-axes of the holes 146C are disposed along the direction d1. Accordingly, with aforementioned disposition, the holes 146A, 146B and 146C are alternately disposed along the direction d1 as well as alternately disposed along the direction d2; parts of projections of the holes 146B and 146A in the direction d2 have an overlapping area K9; and parts of projections of the holes 146C and 146A in the direction d1 have an overlapping area K8. As such, additive diffraction in the fixed direction may be further prevented. In other words, in the present embodiment, the three holes 146A, 146B and 146C are used to prevent the fixed spatial frequency for disposing the holes in various directions, but the disclosure is not limited thereto.

Figure 3B:
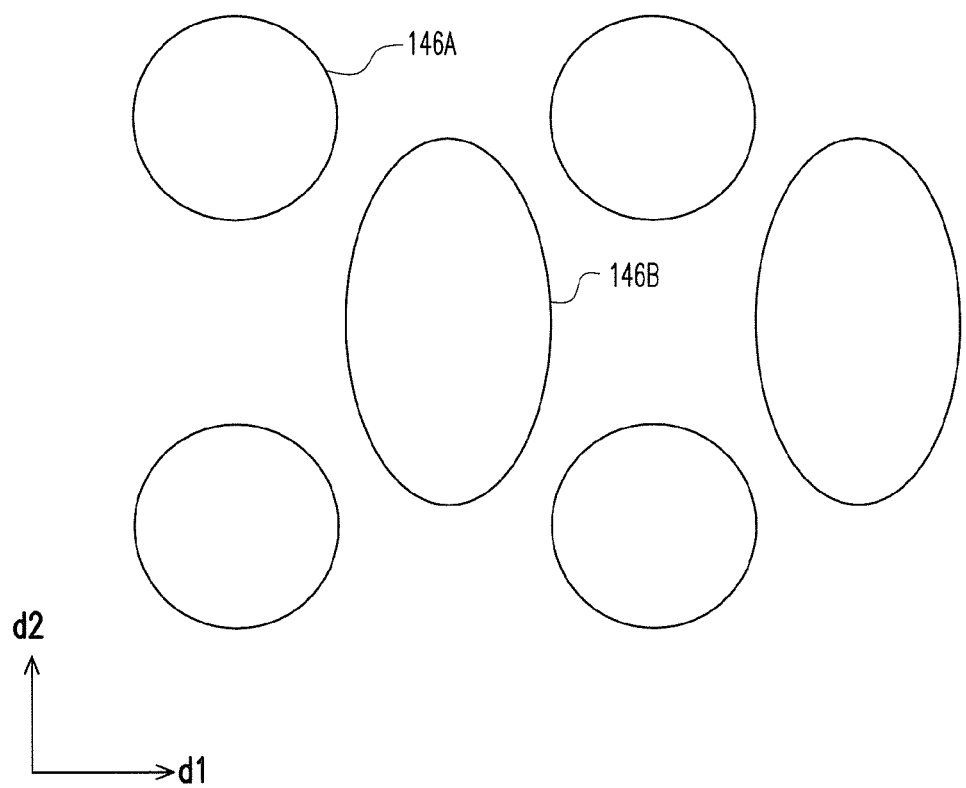
FIGS. 3B to 3D are schematic partial views of displays according to other embodiments of the disclosure.
Figure 3C:
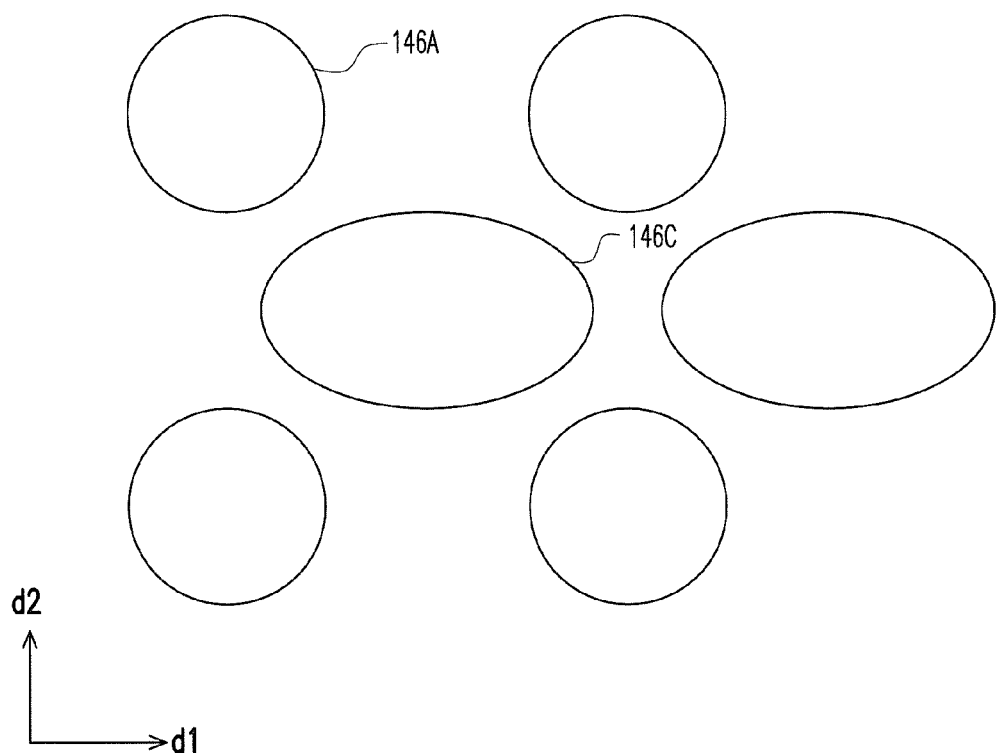
Figure 3D:
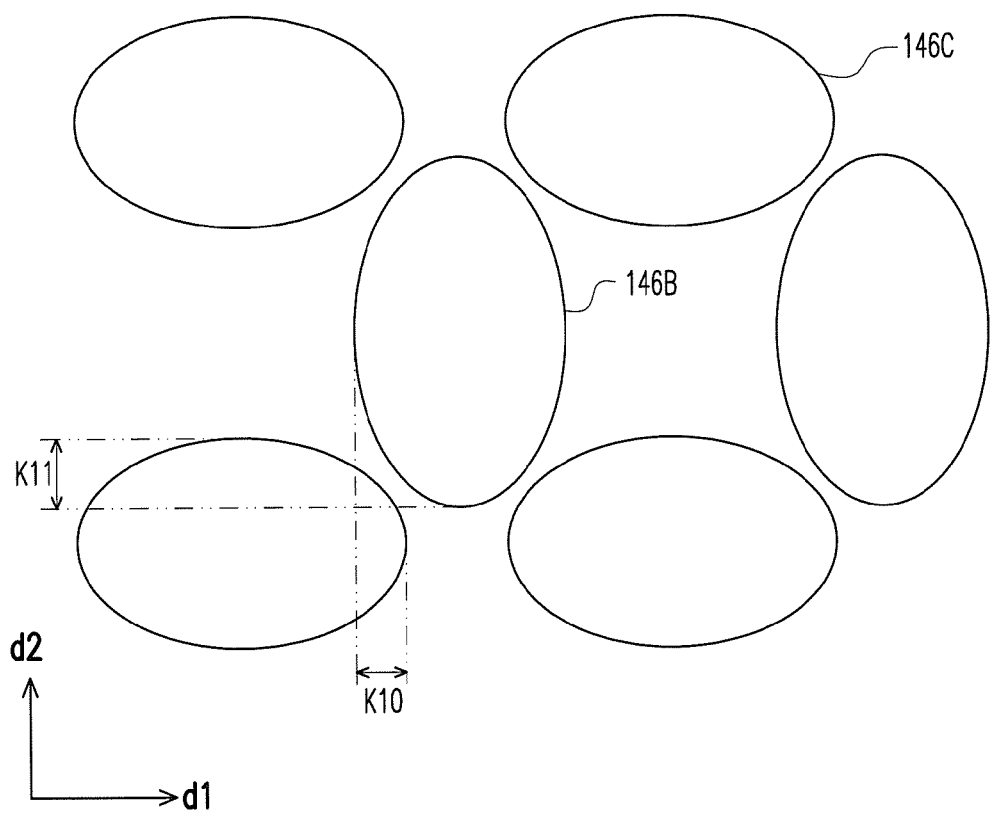

FIGS. 3B to 3D are schematic partial views of displays according to other embodiments of the disclosure. Referring to FIG. 3B, in an embodiment of the disclosure, holes of a display may also be foamed by the holes 146A and 146B, so that their projections in the direction d2 are overlapped with one another. Referring to FIG. 3C, in another embodiment of the disclosure, the holes of the display may also be composed of the holes 146A and 146C, so that their projections in the direction d1 are overlapped with one another. Referring to FIG. 3D, in yet another embodiment of the disclosure, the hole of the display may be formed by the holes 146B and 146C, so that parts of their projections in the direction d1 have an overlapping area K10, and parts of their projections in the direction d2 have an overlapping area K11.

Figure 3E:
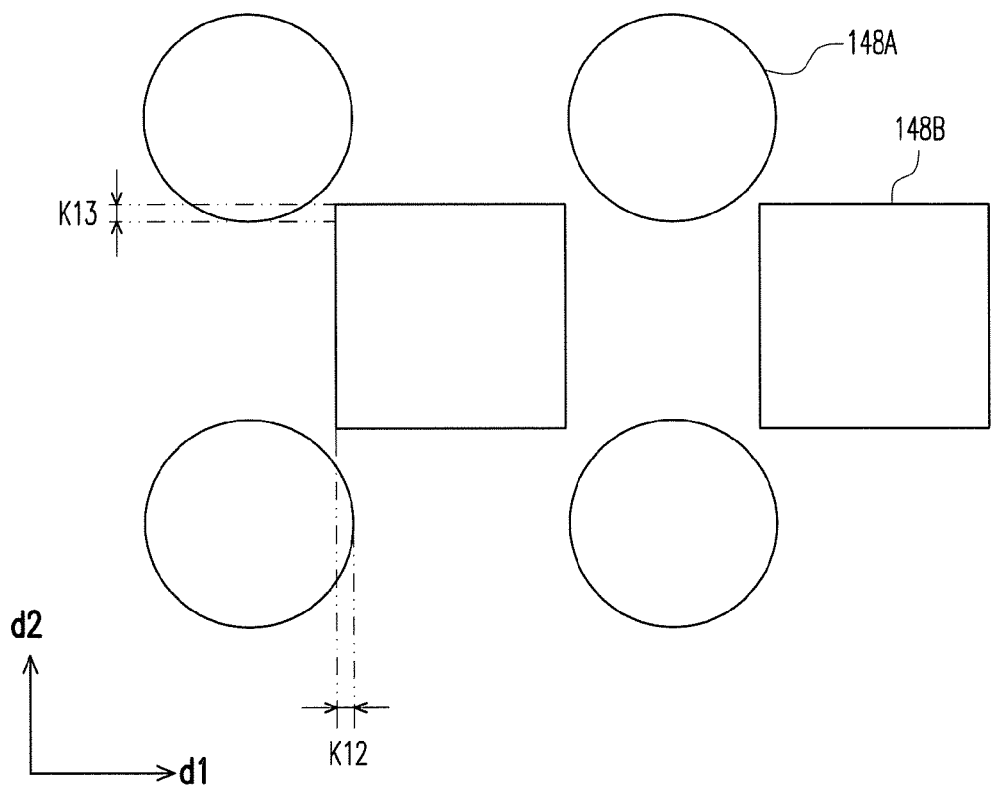
FIG. 3E is a schematic partial view of a display according to an eleventh embodiment of the disclosure.

FIG. 3E is a schematic partial view of a display according to an eleventh embodiment of the disclosure. Referring to FIG. 3E, in the eleventh embodiment of the disclosure, holes may further include a quadrilateral type hole. Specifically, in the present embodiment, the holes are composed of a circular hole 148A and a square hole 148B. Parts of projections of the holes 148A and 148B in the direction d1 have an overlapping area K12, and parts of projections of the holes 148A and 148B in the direction d2 have an overlapping area K13, but the disclosure is not limited thereto. On the other hand, the holes 148A satisfy $$2\sqrt{\pi A} \leq S < \frac{8}{3}\sqrt{3A},$$

so that the edge diffraction generated by the lights passing through the holes 148A will not be too much, and yet sufficient hole areas can be provided for forming favorable transmissive images.

Figure 3F:
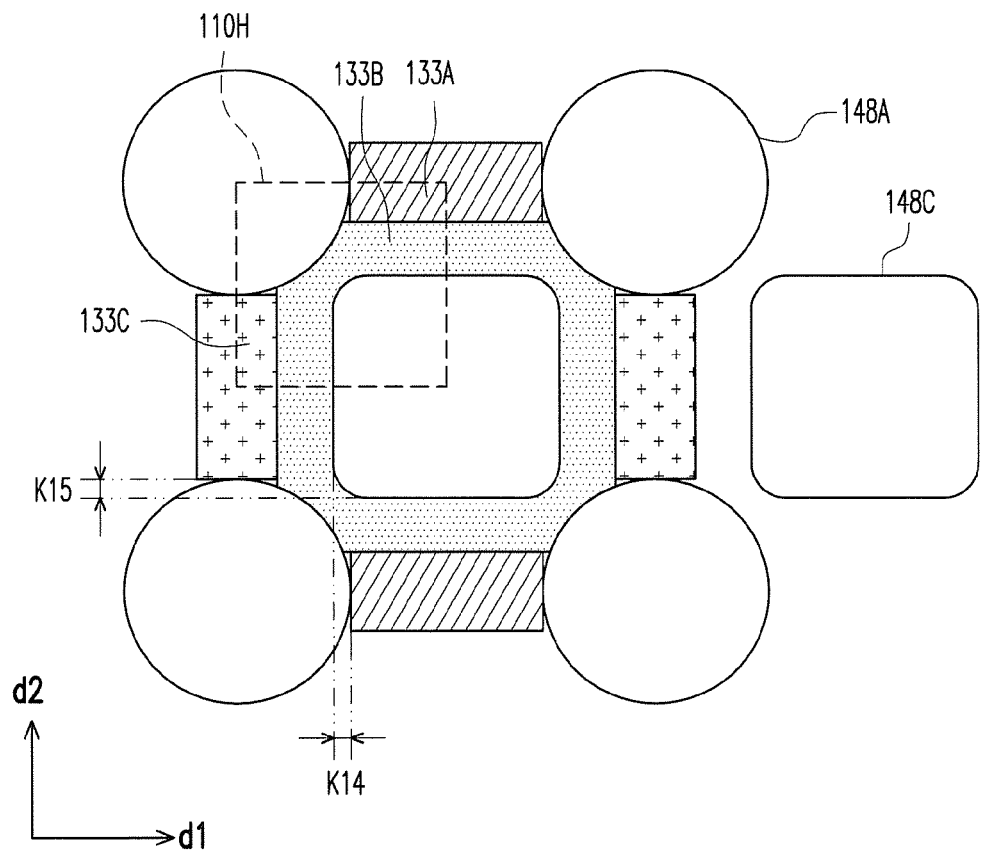
FIG. 3F to FIG. 3H are schematic partial views of displays according to other embodiments of the disclosure.
Figure 3G:
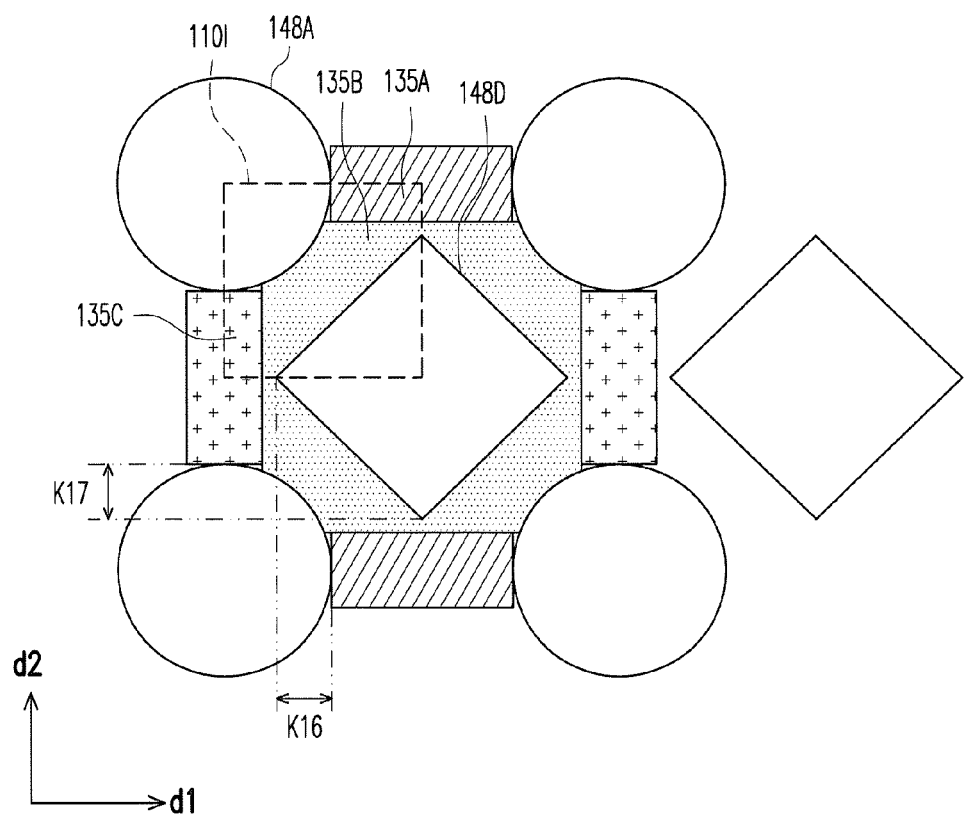
Figure 3H:
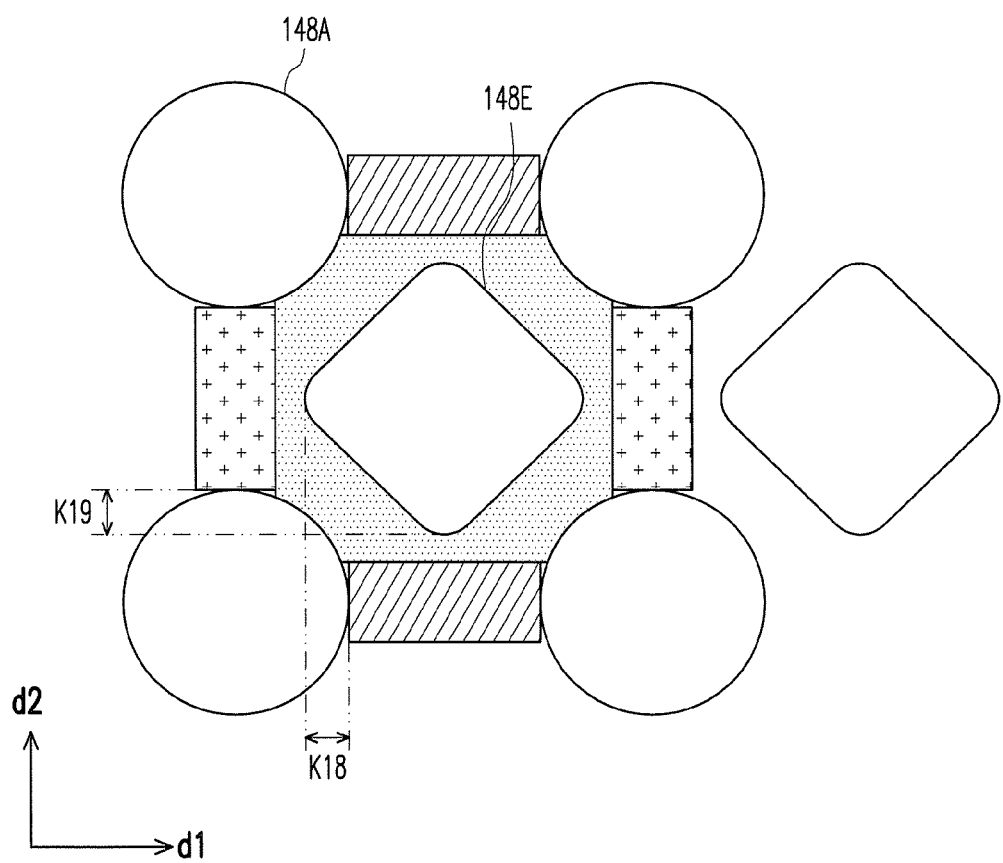

FIG. 3F to FIG. 3H are schematic partial views of displays according to other embodiments of the disclosure. Referring to FIG. 3F, in an embodiment of the disclosure, holes may also be composed of the circular hole 148A and the quadrilateral type hole 148C. The hole 148C has an arc angle to further reduce a length of a perimeter thereof in order reduce the edge diffraction effect. Parts of the projections of the holes 148A and 148C in the direction d1 have an overlapping area K14, and parts of the projections of the holes 148A and 148C in the direction d2 have an overlapping area K15. By disposing the holes 148A and 148C, a flexibility for disposing a first sub-pixel 133A, a second sub-pixel 133B and a third sub-pixel 133C in a display unit 110H may be improved. Meanwhile, because the holes 148A and 148C include the hole 148A of the non-quadrilateral-type shape, the edge diffraction effect may be reduced to provide favorable frames. Referring to FIG. 3G, in another embodiment of the disclosure, the holes may also be composed of the circular hole 148A and a quadrilateral hole 148D. The hole 148D is disposed with a rotation by an angle in relative to aforesaid hole 148B, so as to further improve the flexibility for disposing a first sub-pixel 135A, a second sub-pixel 135B and a third sub-pixel 135C in the display units 110I of a display. Also, areas of projection areas K16 and K17 where projections of the holes 148A and 148D in the direction d1 and the direction d2 are respectively overlapped may be increased accordingly. In other embodiments as provided below with respect to dispositions of holes, because dispositions of the sub-pixels are similar to the first sub-pixels 133A and 135A, the second sub-pixels 133B and 135B and the third sub-pixels 133C and 135C, the disposition relationships of these sub-pixels are not repeatedly described hereinafter.

Referring to FIG. 3H, in yet another embodiment of the disclosure, holes may also be composed of the circular hole 148A and a quadrilateral hole 148E. Herein, the hole 148E has arc angles to further reduce a length of a perimeter thereof in order reduce the edge diffraction effect. Parts of the projections of the holes 148A and 148E in the direction d1 have an overlapping area K18, and parts of the projections of the holes 148A and 148E in the direction d2 have an overlapping area K19.

Figure 4A:
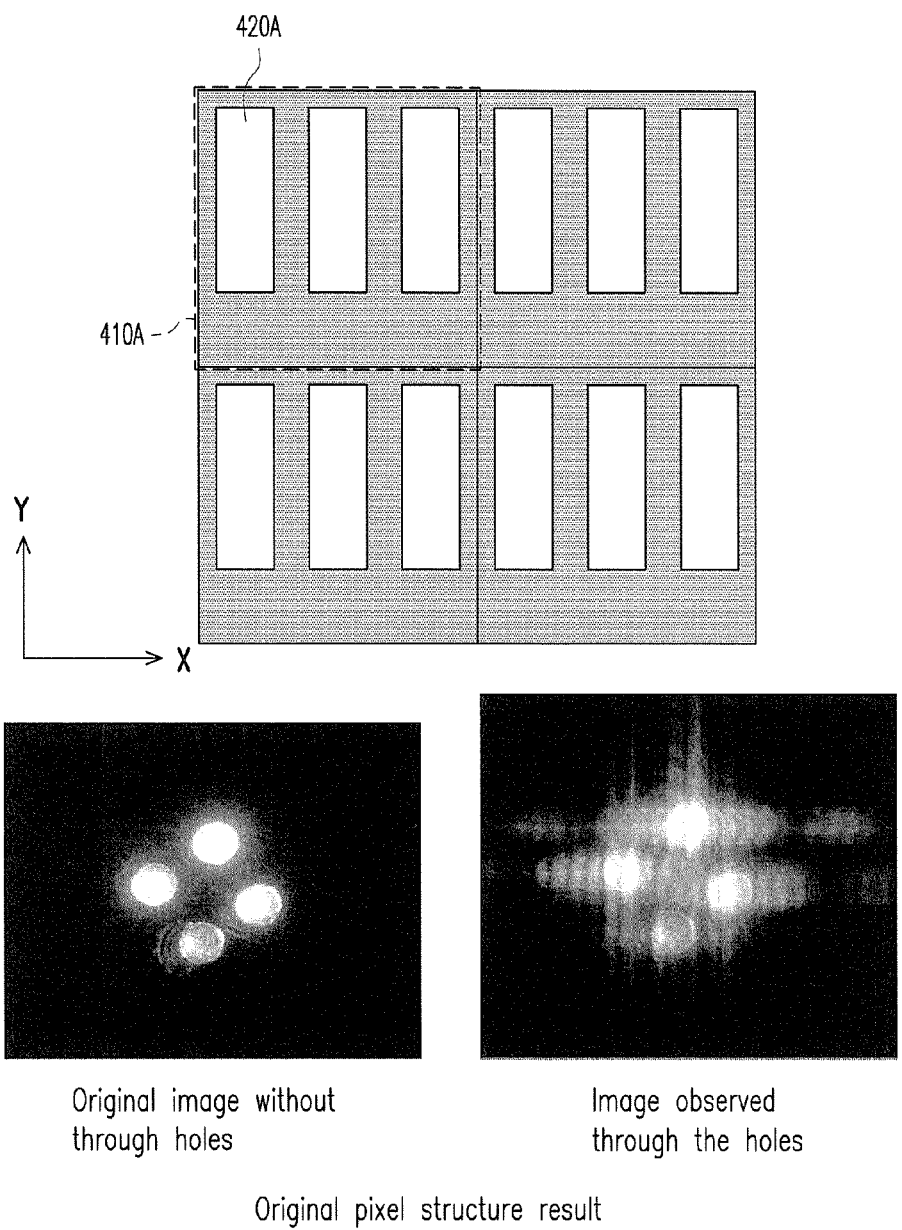
FIG. 4A to FIG. 4C are diagrams each illustrating a schematic view of the holes of a display in a comparative example and an observation diagram of an image obtained after the light source passing through the holes.
Figure 4B:
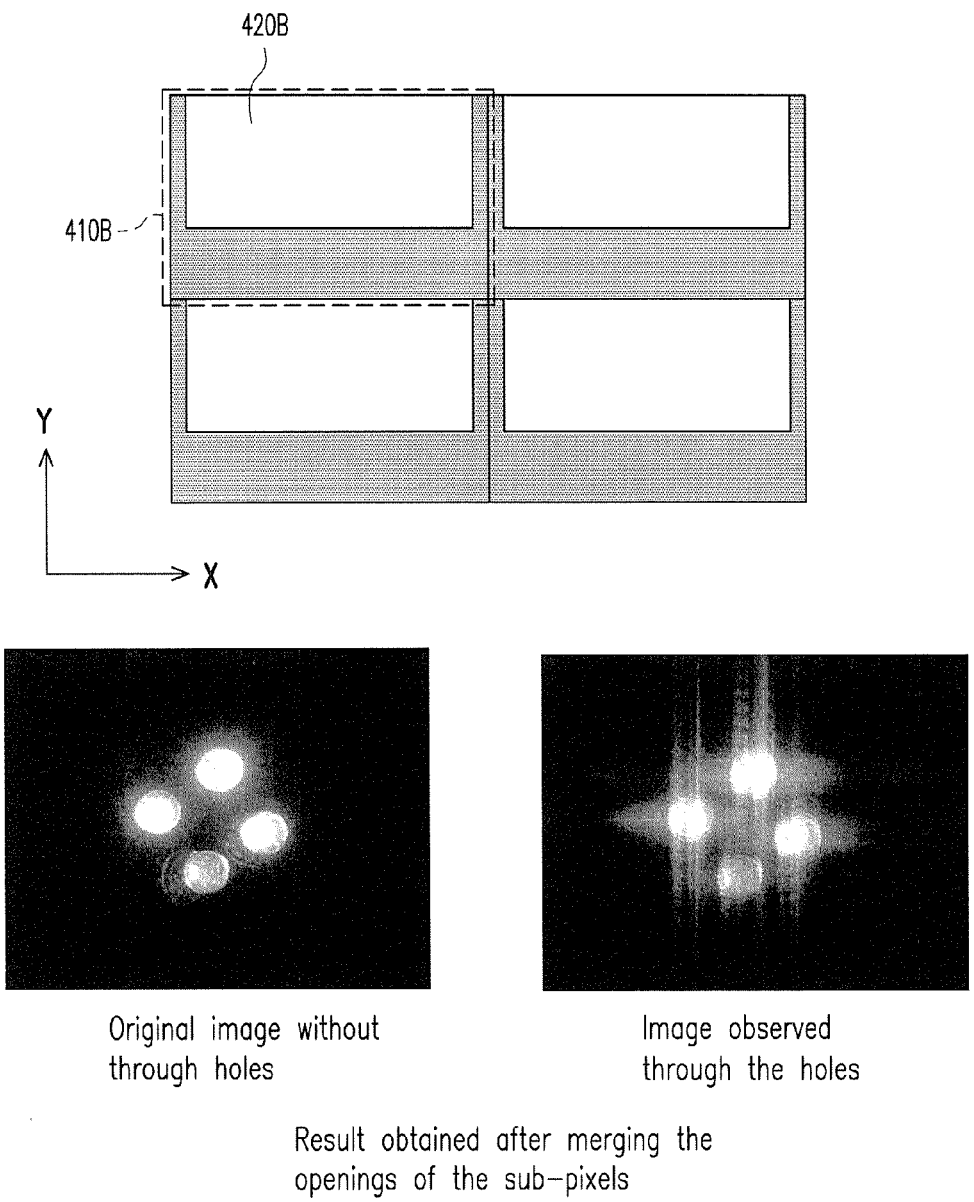
Figure 4C:
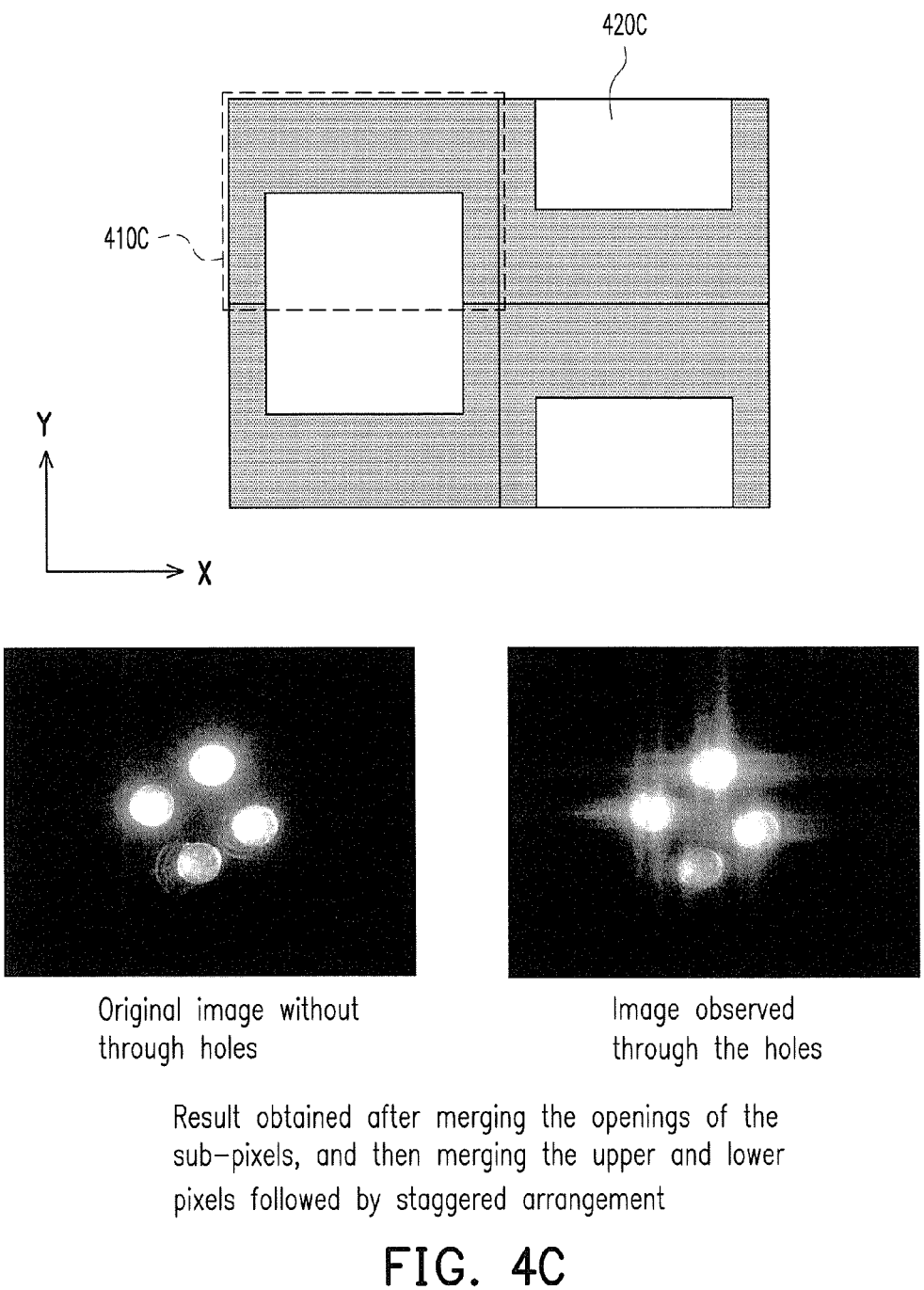
Figure 4D:
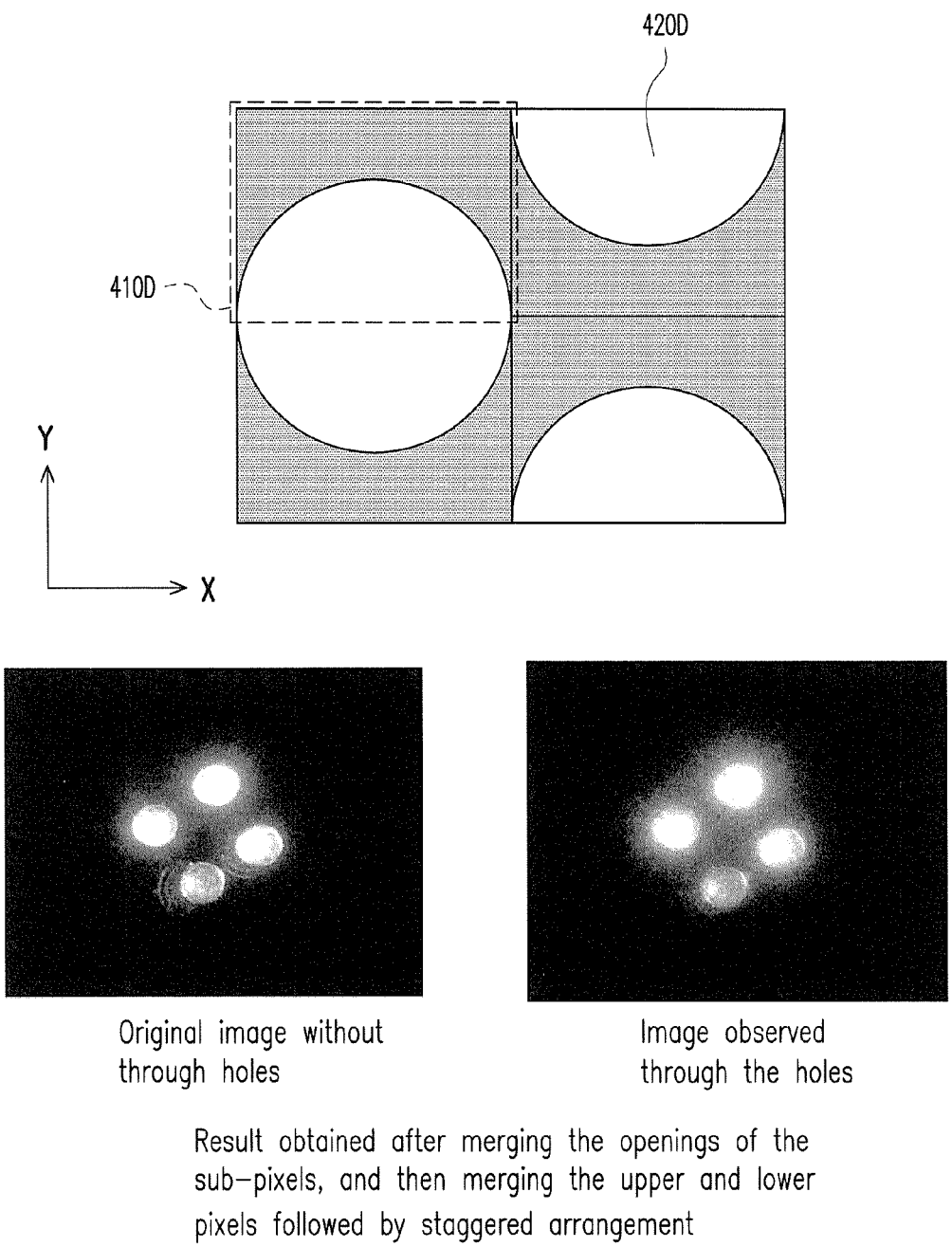
FIG. 4D is a diagram illustrating a schematic view of the holes of a display according to an embodiment of the disclosure and an observation diagram of an image obtained after the light source passing through the holes.

FIG. 4A to FIG. 4C are diagrams each illustrating a schematic view of the holes of a display in a comparative example and an observation diagram of an image obtained after the light source passing through the holes. FIG. 4D is a diagram illustrating a schematic view of the holes of a display according to an embodiment of the disclosure and an observation diagram of an image obtained after the light source passing through the holes. In FIG. 4A to FIG. 4D, upper diagrams illustrate the schematic diagrams of different holes of the displays with the same pixel aperture ratio being 55%, lower left diagrams illustrate an original image actually observed when there is no image light beam passing through the holes, and lower right diagrams illustrate an image actually observed when the image light beams passing through the holes of the display. In view of the actually observed images, it can be verified that patterns of the holes according an embodiment of the disclosure is capable of preventing the light beams passing through holes 420D from generating too much of the edge diffraction as compared to the comparative example.

In view of the above content together with FIG. 4A to FIG. 4D, it can be known that, when the display is dispose with the holes 420D of a display unit 410D according to the embodiment of the disclosure, regardless of which direction, a smaller diffraction width can be obtained. In other words, in the embodiment of the disclosure, as the holes 420D of the display satisfy $$2\sqrt{\pi A} \leq S < \frac{8}{3}\sqrt{3A},$$

a degree of the edge diffraction may be relatively less than the edge diffraction generated by holes (410A, 410B, 410C) of display units (420A, 420B, 420C) in the displays of the comparative example.

In summary, in the display provided according to the embodiment of the disclosure, by disposing each of the holes along a first direction in staggered arrangement and the projections in a second direction are overlapped with one another, the fixed spatial frequency for disposing the holes may be disturbed to reduce the diffraction generated at edges of the holes while maintaining the sufficient aperture ratio. Accordingly, the image passed through the holes may be more clear so that the background observed by the users through the holes may also be more clear. In other words, the circular type holes may reduce the diffraction effect generated at the edges of the holes, the overlapped projections of the holes may provide different combinations for the spatial frequency, and the diffraction enhancement in the fixed direction may be broken after superimposing the diffraction effects. On the other hand, because the at least one of the holes is of the non-quadrilateral-type shape and satisfies $$2\sqrt{\pi A} \leq S < \frac{8}{3}\sqrt{3A},$$

the diffraction generated at the edges of the holes may be reduce while maintaining the sufficient aperture ratio, such that the image passed through the holes may be more clear. As a result, while the display is providing the displayed frame, the users are also able to observe the background clearly through the display.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed:
1. A display, comprising:
a plurality of display units, each of the display units comprising a transparent area; and
a plurality of holes, each of the holes being formed by a part of the transparent areas, and at least one of the holes satisfying:

$$2\sqrt{\pi A} \le S < \frac{8}{3}\sqrt{3A},$$

wherein A is an area of each of the holes, S is a perimeter of each of the holes, the at least one of the holes is a hole of a non-quadrilateral-type shape, the holes are arranged along a first direction in staggered arrangement, parts of projections of the holes along a second direction are overlapped with one another, and the first direction is different from the second direction.

2. The display according to claim 1, further comprising: a plurality of display pixels, each of the display units further comprising a non-transparent area, and the display pixels being disposed on the non-transparent areas.

3. The display according to claim 2, wherein the display pixels comprise a plurality of sub-pixels.

4. The display according to claim 3, wherein the sub-pixels in each of the display pixels emit lights having a plurality of colors.

5. The display according to claim 4, wherein in adjacent two of the display pixels, parts of the sub-pixels emitting the light of the same color are connected to each another.

6. The display according to claim 5, wherein each of the holes is formed by two of the transparent areas which are interconnected among the transparent areas.

7. The display according to claim 3, wherein the sub-pixels in each of the display pixels comprise a first sub-pixel, a second sub-pixel and a third sub-pixel, wherein the first sub-pixel is configured to emit a light having a first color, the second sub-pixel is configured to emit a light having a second color, and the third sub-pixel is configured to emit a light having a third color.

8. The display according to claim 7, wherein in each of the display pixels, a size of the second sub-pixel is different from a size of the first sub-pixel or a size of the third sub-pixel.

9. The display according to claim 8, wherein the first sub-pixels and a part of the holes are alternately arranged along the first direction, the third sub-pixels and the part of the holes are alternately arranged along the second direction, and the first direction is perpendicular to the second direction.

10. The display according to claim 9, wherein the first sub-pixels and another part of the holes are alternately arranged along the second direction, and the third sub-pixels and the another part of the holes are alternately arranged along the first direction.

11. The display according to claim 10, wherein in each of the display pixels, the second sub-pixel is disposed between the first sub-pixel and the third sub-pixel, and the transparent area comprises two openings, wherein the third sub-pixel is disposed between the two openings.

12. The display according to claim 11, wherein each four of the openings are interconnected, and one of the holes is formed by the four interconnected openings.

13. The display according to claim 1, wherein a shape of the at least one hole comprises a circular shape, an oval shape, a polygon having more than four edges, or a combination thereof.

14. The display according to claim 1, wherein the holes have different sizes.

15. The display according to claim 1, wherein the holes have different shapes.

16. The display according to claim 1, wherein parts of projections of the holes along the first direction are overlapped with one another.

* * * * *